(12) United States Patent
Ohta et al.

(10) Patent No.: US 7,843,980 B2
(45) Date of Patent: Nov. 30, 2010

(54) SEMICONDUCTOR LASER DIODE

(75) Inventors: Hiroaki Ohta, Kyoto (JP); Kuniyoshi Okamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 65 days.

(21) Appl. No.: 12/153,278

(22) Filed: May 15, 2008

(65) Prior Publication Data
US 2008/0285609 A1 Nov. 20, 2008

(30) Foreign Application Priority Data
May 16, 2007 (JP) ............... 2007-130753

(51) Int. Cl.
*H01S 5/00* (2006.01)
(52) U.S. Cl. ................ 372/44.011; 372/50.1
(58) Field of Classification Search .......... 372/44.011, 372/46.012, 46.01; 438/33; 257/14
See application file for complete search history.

(56) References Cited

U.S. PATENT DOCUMENTS 6,266,355 B1 * 7/2001 Sverdlov ............... 372/45.01
6,614,824 B2 * 9/2003 Tsuda et al. ............ 372/46.01
7,397,834 B2 * 7/2008 Kozaki et al. ......... 372/46.012
7,606,278 B2 * 10/2009 Kuramoto ............... 372/45.01

OTHER PUBLICATIONS

T. Takeuchi et al., "Theoretical Study of Orientation Dependence of Piezoelectric Effects in Wurtzite Strained GaInN/GaN Heterostructures and Quantum Wells," Jpn. J. Appl. Phys. vol. 39 (2000) pp. 413-416.

* cited by examiner

*Primary Examiner*—Minsun Harvey
*Assistant Examiner*—Tuan N. Nguyen
(74) *Attorney, Agent, or Firm*—Rabin & Berdo, P.C.

(57) ABSTRACT

An inventive semiconductor laser diode includes a Group III nitride semiconductor layered structure having a major crystal growth plane defined by a non-polar or semi-polar-plane. The Group III nitride semiconductor layered structure includes: a p-type cladding layer and an n-type cladding layer; an In-containing p-type guide layer and an In-containing n-type guide layer held between the p-type cladding layer and the n-type cladding layer; and an In-containing light emitting layer held between the p-type guide layer and the n-type guide layer.

10 Claims, 7 Drawing Sheets

SEMICONDUCTOR LASER DIODE

BACKGROUND OF THE INVENTION

1. Field of the Invention

The present invention relates to a semiconductor laser diode including a semiconductor layered structure of Group III nitride semiconductors.

2. Description of the Related Art

Group III-V semiconductors including nitrogen as a Group V element are generally called "Group III nitride semiconductors" and typical examples thereof include aluminum nitride (AlN), gallium nitride (GaN) and indium nitride (InN), which are generally represented by a composition formula $Al_xIn_yGa_{1-x-y}N$ ($0 \leq x \leq 1$, $0 \leq y \leq 1$ and $0 \leq x+y \leq 1$).

Short-wavelength laser sources such as blue and green laser sources are utilized in the fields of high density recording in optical disks typified by DVDs, image processing, medical apparatuses and measuring apparatuses. Such a short-wavelength laser source includes a laser diode employing, for example, a GaN semiconductor.

The GaN semiconductor laser diode is produced by growing Group III nitride semiconductors on a nitride gallium (GaN) substrate having a major plane defined by a c-plane through metal-organic vapor phase epitaxy (MOVPE). More specifically, an n-type GaN contact layer, an n-type AlGaN cladding layer, an n-type GaN guide layer, an active layer (light emitting layer) a p-type GaN guide layer, a p-type AlGaN cladding layer and a p-type GaN contact layer are sequentially grown on the GaN substrate through the metal-organic vapor phase epitaxy, whereby a semiconductor layered structure including these semiconductor layers is formed. In the active layer, electrons injected from the n-type layers and positive holes injected from the p-type layers are recombined, whereby the active layer generates light. The light is confined between the n-type AlGaN cladding layer and the p-type AlGaN cladding layer, and transmitted in a transmission direction perpendicular to a stacking direction in which the aforementioned semiconductor layers are stacked in the semiconductor layered structure. The active layer has resonator end faces present at opposite ends thereof with respect to the transmission direction. The light is resonantly amplified between the pair of resonator end faces by repeated induced emission, and a part of the light is emitted as a laser beam from one of the resonator end faces.

It is a conventional practice to use AlGaN for the cladding layers and use GaN for the guide layers in the GaN semiconductor laser diode irrespective of a wavelength range.

The combinational use of the AlGaN cladding layers and the GaN guide layers is suitable for confinement of light of a wavelength (e.g., 405 nm) in a blue wavelength range. However, light of a wavelength (e.g., 532 nm) in a green wavelength range cannot be properly confined, so that the light generated by the active layer is likely to leak to the outside. This problem will be described in detail with reference to FIG. 11.

Figure 11:
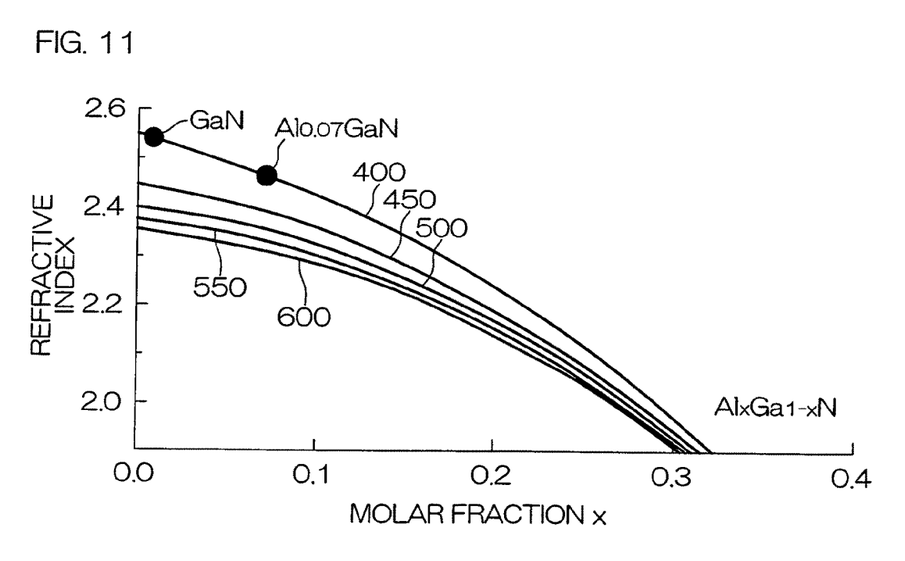
FIG. 11 is a diagram showing changes in refractive index with respect to the Al content x of AlGaN.

FIG. 11 shows changes in refractive index with respect to the Al content x of AlGaN. In FIG. 11, curves respectively show changes in refractive index at different wavelengths, i.e., at wavelengths of 400 nm, 450 nm, 500 nm, 550 nm and 600 nm. A curve for a wavelength of 400 nm indicates that $Al_xGa_{1-x}N$ having an Al content of zero, i.e., GaN, has a refractive index of 2.53. Further, $Al_xGa_{1-x}N$ having an Al content of 0.07, i.e., $Al_{0.07}GaN$ (which means $Al_{0.07}Ga_{0.93}N$ with an Al content of 0.07 in $Al_xGa_{1-x}N$, hereinafter expressed by a notation of $Al_{0.07}GaN$ for simplicity because the composition ratio between the Group III element and the Group V element is 1:1), has a refractive index of 2.47. It is generally known that a refractive index difference $\Delta n$ of not less than 0.04 (preferably not less than 0.05) observed between the guide layers and the cladding layers is sufficient for the confinement of the light. In the case of a laser diode having a light emission wavelength of about 400 nm, therefore, the combination of the GaN guide layers and the $Al_{0.07}GaN$ cladding layers permits proper confinement of the light in an optical waveguide.

However, the change in the refractive index with respect to an increase in the Al content is reduced as the wavelength increases. Where the wavelength is not less than 500 nm, the refractive index difference $\Delta n$ is less than 0.04 for the combination of the GaN guide layers and the $Al_{0.07}GaN$ cladding layers. Therefore, light having a wavelength (e.g., 532 nm) in the green wavelength range cannot be sufficiently confined. Since the change in the refractive index with respect to the change in the composition of the Group III nitride semiconductor depends upon the wavelength, it is necessary to properly select the compositions of the cladding layers and the guide layers according to the light emission wavelength.

FIG. 11 indicates that an AlGaN layer differing in refractive index by a difference $\Delta n$ of not less than 0.04 from GaN can be formed by increasing the Al content for a light emission wavelength of not less than 500 nm.

However, if the Al content is increased, the degree of lattice mismatch with respect to the GaN substrate is increased. Therefore, cracking is liable to occur, resulting in a lower yield. In reality, this makes it difficult to increase the refractive index difference $\Delta n$ between the AlGaN cladding layers and the GaN guide layers to not less than 0.04 (more preferably not less than 0.05) for a light emission wavelength of not less than 500 nm.

In view of the foregoing, it is generally difficult to increase the refractive index difference $\Delta n$ to not less than 0.04 (more preferably not less than 0.05) by using the AlGaN cladding layers and the GaN guide layers in combination for a light emission wavelength range not less than 450 nm.

SUMMARY OF THE INVENTION

It is an object of the present invention to provide a semiconductor laser diode which is excellent in crystal quality and is capable of properly confining light emitted at a light emission wavelength of not less than 450 nm.

According to the present invention, there is provided a semiconductor laser diode including a Group III nitride semiconductor layered structure having a major crystal growth plane defined by a non-polar or semi-polar plane. The Group III nitride semiconductor layered structure includes: a p-type cladding layer and an n-type cladding layer; an In-containing p-type guide layer and an In-containing n-type guide layer held between the p-type cladding layer and the n-type cladding layer; and an In-containing light emitting layer held between the p-type guide layer and the n-type guide layer.

With this arrangement, the guide layers are composed of a Group III nitride semiconductor containing In (indium). Thus, the guide layers and the cladding layers can have a required refractive index difference (e.g., 0.04, more preferably not less than 0.05) for a wavelength range not less than 450 nm, thereby achieving proper light confinement. In addition, the proper light confinement is achieved without the need for a Group III nitride semiconductor layer having a higher Al content, so that the Group III nitride semiconductor layered structure is free from cracking attributable to lattice mismatch and is excellent in crystal quality. Thus, the semiconductor laser diode is provided as having excellent oscillation efficiency.

In addition, the major crystal growth plane of the Group III nitride semiconductor layered structure is defined by the non-polar or semi-polar plane, so that the Group III nitride semiconductor layered structure is less susceptible to polarization as compared with a case in which the major plane is defined by a polar plane (c-plane). This makes it possible to increase the In content in the light emitting layer and the guide layers without the influence of the polarization and to improve the light confinement efficiency by increasing the thicknesses of the guide layers. Where the light emitting layer has a quantum well structure when the major crystal growth plane is defined by the polar surface, for example, carriers are divided by piezoelectric self-polarization occurring in quantum wells (for example, containing In), thereby reducing the light emission efficiency. Particularly, if an attempt is made to increase the wavelength by increasing the In content, the piezoelectric self-polarization is aggravated. The total thickness of the guide layers, e.g., the p-type guide layer and the n-type guide layer, is about 1000 Å and, if the major crystal plane is defined by the polar surface, a built-in voltage is increased by the influence of the polarization. In the present invention, on the contrary, the semiconductor laser diode includes the Group III nitride semiconductor layered structure with its major crystal growth plane defined by the non-polar or semi-polar plane, whereby the division of the carriers attributable to the piezoelectric self-polarization is suppressed to improve the light emission efficiency. As a result, it is possible to minimize a threshold voltage required for causing laser oscillation and to improve the slope efficiency. Further, the light emission wavelength is made less dependent upon the current by suppressing the division of the carriers attributable to the piezoelectric self-polarization, so that the light emission wavelength is stabilized.

The non-polar plane is an a-plane or an m-plane. Further, the semi-polar plane is, for example, a (10-1-1) plane, a (10-1-3) plane or a (11-22) plane.

The cladding layers are preferably each composed of a Group III nitride semiconductor having an average Al content of less than 7% (preferably less than 5%). It is more preferred that the cladding layers are each composed of an Al-free Group III nitride semiconductor.

With this arrangement, the semiconductor laser diode is provided, which is substantially free from cracking and advantageously has a light emission wavelength of not less than 460 nm.

Where the cladding layers are free from Al, the Group III nitride semiconductor layered structure can be easily grown. More specifically, although a reduced pressure (e.g., not higher than 50 kPa) is required for the growth of the Al-containing Group III nitride semiconductor (e.g., AlGaN), it is possible to grow the Al-free Group III nitride semiconductor (e.g., GaN, InGaN) at a relatively high pressure (e.g., 100 kPa). In the prior art which involves the growth of the AlGaN cladding layers, therefore, pressures required for the crystal growth of the respective layers significantly differ from each other, resulting in difficulty in designing a crystal growing apparatus. Where the cladding layers are composed of the Al-free Group III nitride semiconductor, on the other hand, the growth of the cladding layers, the growth of the guide layers and the growth of the light emitting layer can be achieved under similar pressure conditions, making it easier to design the crystal growing apparatus.

In addition, the growth temperature of AlGaN is high (e.g., not lower than 1050° C.), so that the In-containing light emitting layer is liable to be thermally damaged. Where the cladding layers are formed of the Al-free Group III nitride semiconductor, on the contrary, the formation of the cladding layers can be achieved at a relatively low temperature (e.g., not higher than 1000° C.). Therefore, even if the formation of the cladding layer follows the formation of the light emitting layer, the thermal damage to the light emitting layer is suppressed. This improves the light emission efficiency.

A refractive index difference between the guide layers and the cladding layers is preferably designed to be not less than 0.04 (more preferably not less than 0.05). Thus, the light can be more reliably confined.

Where the light emission wavelength of the light emitting layer is in a blue range around 460 nm, for example, it is suitable that the cladding layers each have an average Al content of less than 5%. More preferably, the cladding layers each have an Al content of 2% to 5%, and the guide layers each have an In content of 1% to 3%.

Where the light emission wavelength of the light emitting layer is in a green range around 530 nm, for example, the cladding layers each have an average Al content of less than 1%, preferably 0%. In this case, the guide layers each have an In content of 3% to 5%.

The light emitting layer preferably has a multiple-quantum well structure having a plurality of In-containing well layers (preferably not more than three In-containing well layers) each having a thickness of not greater than 100 Å. This arrangement increases the light emission efficiency.

The major crystal growth plane of the Group III nitride semiconductor layered structure is preferably defined by the m-plane. The m-plane is a stable non-polar plane and, therefore, permits very stable crystal growth. Thus, the crystal quality is improved as compared with the case in which the major crystal growth plane is defined by the c-plane or other crystal plane. As a result, the laser diode can be produced as having higher performance.

Where the major crystal growth plane is defined by the m-plane, the Group III nitride semiconductor layered structure is a structure such that the n-type cladding layer, the n-type guide layer, the light emitting layer, the p-type guide layer and the p-type cladding layer are stacked along an m-axis. Light extracted from a light emitting layer of a Group III nitride semiconductor having a major crystal growth plane defined by the c-plane is in a randomly optically polarized state (optically unpolarized state). On the other hand, a light emitting layer of a Group III nitride semiconductor having a major crystal growth plane defined by a plane other than the c-plane, i.e., the non-polar or semi-polar plane (e.g., the a-plane or the m-plane) is capable of emitting light in a strongly optically polarized state. The light emitting layer with its major crystal growth plane defined by the m-plane generates light containing a greater amount of an optically polarized component parallel to the m-plane (more specifically, a component optically polarized along an a-axis). This makes it possible to utilize a greater proportion of the light generated by the light emitting layer for the laser oscillation, thereby improving the laser oscillation efficiency to reduce the threshold current.

With the major crystal growth plane being defined by the m-plane, physical anisotropy is observed with respect to the c-axis and the a-axis. Where the light emitting layer has the quantum well structure (more specifically, the In-containing quantum well structure), for example, the In-containing light emitting layer (active layer) has a quantum well band structure different from that of a semiconductor laser having a major crystal growth plane defined by the c-plane due to a biaxial stress attributable to lattice strain. This provides a gain different from that to be provided by the c-plane semiconductor laser, thereby improving laser characteristics.

Further, the Group III nitride semiconductor layered structure is preferably a Group III nitride semiconductor layered structure formed through crystal growth on a GaN substrate. Thus, the Group III nitride semiconductor layers are excellent in crystal quality with little layering defects, permitting more efficient light emission. Further, the GaN substrate has higher heat conductivity, thereby improving heat dissipation.

Particularly, the Group III nitride semiconductor layered structure is preferably a Group III nitride semiconductor layered structure formed through crystal growth on a GaN monocrystalline substrate having a crystal growth plane defined by the m-plane. By using a GaN monocrystalline substrate having a very low dislocation density (preferably having no dislocation), the Group III nitride semiconductor layered structure is formed as a high quality crystal body with little defects. Thus, the laser diode can be produced as having higher performance. More specifically, the Group III nitride semiconductor layered structure can be formed as a crystal body grown from the growth plane of the GaN substrate without any layering defects and threading dislocation. This minimizes a characteristic degradation factor such as reduction in light emission efficiency attributable to the defects.

The major plane of the GaN monocrystalline substrate preferably has an off-angle within ±1 degree (with respect to the m-plane). This permits more reliable growth of a flat Group III nitride semiconductor crystal free from dislocation.

The Group III nitride semiconductor layered structure may include a p-type semiconductor layered portion including the p-type cladding layer. The p-type semiconductor layered portion is formed in a stripe extending in a predetermined direction by partial removal thereof, and has a pair of resonator end faces perpendicular to the stripe extending direction. With this arrangement, the semiconductor laser is excellent in mass-productivity and in characteristic reproducibility, because the p-type semiconductor layered portion is formed in the stripe by the partial removal thereof.

The stripe has a ridge shape (mesa shape) and a surface portion of the stripe except for a contact portion in contact with a p-side electrode is preferably protected by an insulating film. With this arrangement, the light is moderately laterally confined, so that the light confinement can be easily controlled. Further, lateral current leakage can be prevented. A material for the insulating film preferably has a refractive index of greater than 1, and examples thereof include $ZrO_2$ or $SiO_2$.

Where the major growth plane of the Group III nitride semiconductor layered structure is defined by the m-plane, it is preferred that the stripe extends along the c-axis, and the pair of resonator end faces are respectively defined by a +c-plane and a −c-plane. With this arrangement, the stripe is formed as extending along the c-axis and having cleaved surfaces extending along the c-planes, whereby the resonator end faces can be properly formed.

The resonator end face defined by the −c-plane is preferably covered with a protective film formed of an insulating film. With this arrangement, the −c-plane, which is chemically vulnerable and hence liable to be dissolved in alkali, is protected by the insulative protective film, whereby the reliability is enhanced.

Where the light emitting layer has the quantum well structure, the quantum wells of the quantum well structure preferably each have a flatness of not greater than 10 Å as measured along the c-axis. With this arrangement, the emission spectrum has a reduced half bandwidth. Further, where the stripe is formed as extending along the c-axis, photons can be transmitted through the optical waveguide with a reduced absorption loss.

Where the major crystal growth plane of the Group III nitride semiconductor layered structure is defined by the m-plane, the stripe may extend along the a-axis, and the pair of resonator end faces may be each defined by the a-plane. When the Group III nitride semiconductor layered structure is formed through the crystal growth, layering defects are liable to occur parallel to the c-plane. Therefore, if the stripe is formed as extending along the a-axis parallel to the c-plane and the pair of the resonator end faces are each defined by the a-plane, the layering defects do not cross the optical waveguide. This prevents the layering defects from interfering with the optical waveguide and from increasing the leak current.

The resonator end faces are each preferably a cleaved surface. This permits the resonator end faces to have excellent properties, and suppresses irregular light reflection which may otherwise occur due to minute undulations.

Where the major crystal growth plane of the Group III nitride semiconductor layered structure is defined by the m-plane, it is preferred that the p-side electrode is provided on the m-plane of the p-type semiconductor layered portion, that the Group III nitride semiconductor layered structure is grown on one major surface of an electrically conductive substrate (e.g., a GaN substrate), that the other major surface of the electrically conductive substrate is defined by the m-plane, and that an n-side electrode is provided on the other major surface of the electrically conductive substrate. With this arrangement, the p-side electrode and the n-side electrode are each provided on the stable m-plane. Therefore, the Group III nitride semiconductor layered structure is highly reliable to sufficiently withstand a higher laser output and higher temperature operation. In the case of the prior art laser diode in which the major growth plane is defined by the c-plane, for example, a backside crystal plane is defined by the −c-plane and hence has poorer reliability.

The Group III nitride semiconductor layered structure preferably further includes an In-containing layer having a biaxial stress and provided between the n-type cladding layer and the substrate carrying the Group III nitride semiconductor layered structure. With this arrangement, the provision of the In-containing layer having the biaxial stress suppresses development of cracks (crystal cracks) parallel to the c-plane in the Group III nitride semiconductor layered structure.

The Group III nitride semiconductor layered structure preferably includes an n-type semiconductor layered portion including the n-type cladding layer, the n-type semiconductor layered portion being at least partly formed through crystal growth (e.g., through the metal-organic vapor phase epitaxy) under conditions such that a V/III ratio indicating the ratio of a nitrogen material to a Group III element material is not less than 1000 (e.g., not less than 3000). With this arrangement, the n-type semiconductor layered portion can be grown as having excellent crystal quality, so that the crystal quality of the light emitting layer grown on the n-type semiconductor layered portion is improved. As a result, the light emission characteristic can be improved.

The Group III nitride semiconductor layered structure preferably has an average V/III ratio of not less than 100 which is defined as an average of the ratios of the nitrogen material to the Group III element material in the respective semiconductor layers ranging from the n-type cladding layer to the uppermost p-type contact layer. With this arrangement, particularly where the major crystal growth plane is defined by the m-plane, the n-type cladding layer, the light emitting layer and the p-type cladding layer can be each formed of excellent crystal with little point defects.

The light emitting layer is preferably composed of AlInGaN containing not less than 13% of In, and preferably emits photons at a wavelength of 450 nm to 550 nm. If the light emitting layer having the multiple-quantum well structure was formed of AlInGaN containing not less than 13% of In with its major crystal growth plane defined by the c-plane for light emission at a wavelength of 450 nm to 550 nm, for example, remarkable polarization would occur in the quantum wells. In the present invention, on the contrary, the polarization in the quantum wells is suppressed, because the Group III nitride semiconductor layered structure having the major crystal growth plane defined by the non-polar or semi-polar plane is used. This increases the light emission efficiency. That is, a remarkable light emission efficiency improving effect can be provided for the wavelength range of 450 nm to 550 nm by the suppression of the polarization.

The light emitting layer is preferably a light emitting layer formed through crystal growth at a growth pressure not less than 700 torr. A temperature for the growth of the In-containing light emitting layer can be increased for a higher growth pressure. Therefore, the light emitting layer can be formed as having excellent heat resistance.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
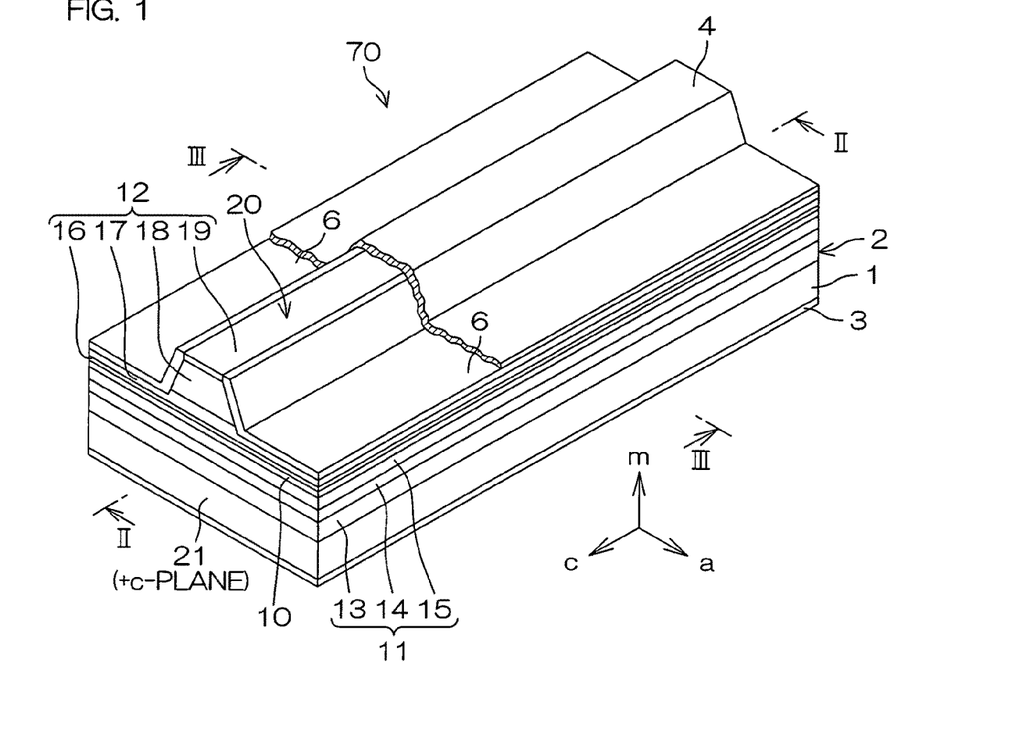
FIG. 1 is a perspective view for explaining the construction of a semiconductor laser diode according to a first embodiment of the present invention.
Figure 2:
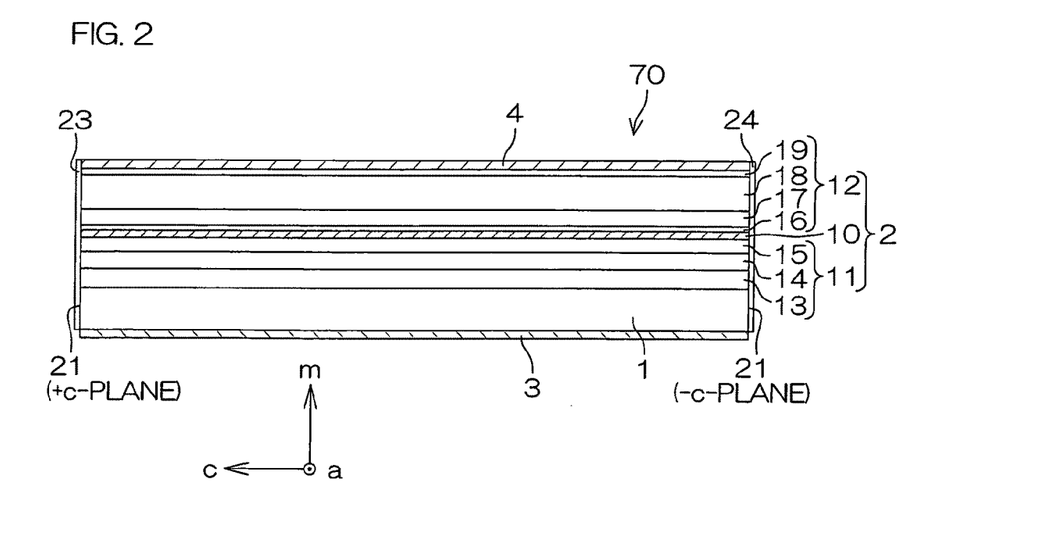
FIG. 2 is a longitudinal sectional view taken along a line II-II in FIG. 1.
Figure 3:
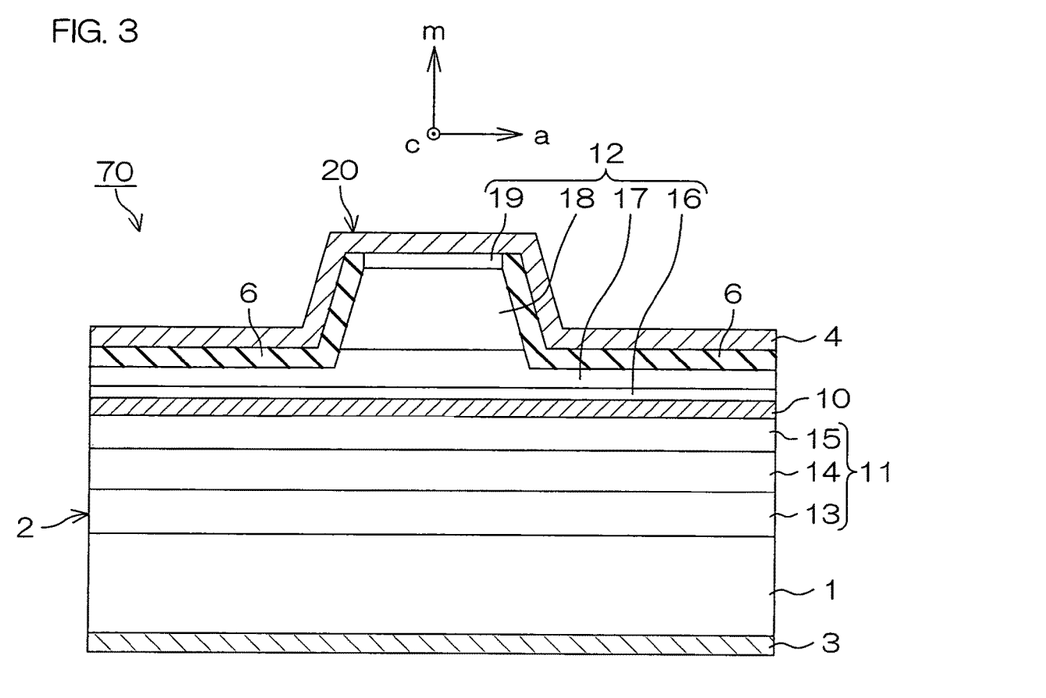
FIG. 3 is a transverse sectional view taken along a line III-III in FIG. 1.

FIG. 1 is a perspective view for explaining the construction of a semiconductor laser diode according to a first embodiment of the present invention. FIG. 2 is a longitudinal sectional view taken along a line II-II in FIG. 1, and FIG. 3 is a transverse sectional view taken along a line III-III in FIG. 1.

The semiconductor laser diode 70 is of a Fabry-Perot type, which includes a substrate 1, a Group III nitride semiconductor layered structure 2 formed on the substrate 1 through crystal growth, an n-side electrode 3 provided in contact with a rear surface of the substrate 1 (a surface of the substrate 1 opposite from the Group III nitride semiconductor layered structure 2), and a p-side electrode 4 provided in contact with a front surface of the Group III nitride semiconductor layered structure 2.

In this embodiment, the substrate 1 is a GaN monocrystalline substrate. The substrate 1 has a major surface defined by an m-plane, and the Group III nitride semiconductor layered structure 2 is formed through the crystal growth on the major surface of the substrate 1. Therefore, the Group III nitride semiconductor layered structure 2 is formed of Group III nitride semiconductors each having a major crystal growth plane defined by the m-plane.

The Group III nitride semiconductor layered structure 2 includes a light emitting layer 10, an n-type semiconductor layered portion 11 and a p-type semiconductor layered portion 12. The n-type semiconductor layered portion 11 is disposed on a side of the light emitting layer 10 closer to the substrate 1, while the p-type semiconductor layered portion 12 is disposed on a side of the light emitting layer 10 closer to the p-side electrode 4. Thus, the light emitting layer 10 is held between the n-type semiconductor layered portion 11 and the p-type semiconductor layered portion 12, whereby a double hetero junction structure is provided. Electrons are injected into the light emitting layer 10 from the n-type semiconductor layered portion 11, while positive holes are injected into the light emitting layer 10 from the p-type semiconductor layered portion 12. The electrons and the positive holes are recombined in the light emitting layer 10 to generate light.

The n-type semiconductor layered portion 11 includes an n-type GaN contact layer 13 (e.g., having a thickness of 2 μm), an n-type GaN cladding layer 14 (having a thickness not greater than 1.5 μm, for example, a thickness of 1.0 μm) and an n-type InGaN guide layer 15 (e.g., having a thickness of 0.1 μm), which are stacked in this order on the substrate 1. On the other hand, the p-type semiconductor layered portion 12 includes a p-type AlGaN electron blocking layer 16 (e.g., having a thickness of 20 μm), a p-type InGaN guide layer 17 (e.g., having a thickness of 0.1 μm), a p-type GaN cladding layer 18 (having a thickness not greater than 1.5 μm, for example, a thickness of 0.4 μm) and a p-type GaN contact layer 19 (e.g., having a thickness of 0.1 μm), which are stacked in this order on the light emitting layer 10.

The n-type GaN contact layer 13 is a lower resistance layer. The p-type GaN contact layer 19 is a lower resistance layer which provides ohmic contact with the p-side electrode 4. The n-type GaN contact layer 13 is formed of an n-type semiconductor by doping GaN, for example, with Si as an n-type dopant at a higher doping concentration (e.g., $3 \times 10^{18}$ $cm^{-3}$). Further, the p-type GaN contact layer 19 is formed of a p-type semiconductor layer by doping GaN with Mg as a p-type dopant at a higher doping concentration (e.g., $3 \times 10^{19}$ $cm^{-3}$).

The n-type GaN cladding layer 14 and the p-type GaN cladding layer 18 provide a light confining effect for confining the light generated by the light emitting layer 10 therebetween. The n-type GaN cladding layer 14 is formed of an n-type semiconductor by doping GaN, for example, with Si as an n-type dopant (e.g., at a doping concentration of $1 \times 10^{18}$ $cm^{-3}$). Further, the p-type GaN cladding layer 18 is formed of a p-type semiconductor layer by doping GaN with Mg as a p-type dopant (e.g., at a doping concentration of $1 \times 10^{19}$ cm$^{-3}$). The n-type GaN cladding layer 14 has a greater band gap than the n-type InGaN guide layer 15, and the p-type GaN cladding layer 18 has a greater band gap than the p-type InGaN guide layer 17. Thus, the GaN cladding layers 14, 18 are sufficiently great in refractive index than the InGaN guide layers 15, 17, permitting proper light confinement. Thus, the semiconductor laser diode has a lower threshold and a higher efficiency.

The n-type InGaN guide layer 15 and the p-type InGaN guide layer 17 are semiconductor layers which provide a carrier confining effect for confining carriers (electrons and positive holes) in the light emitting layer 10. Thus, the recombination of the electrons and the positive holes in the light emitting layer 10 is achieved at a higher efficiency. The n-type InGaN guide layer 15 is formed of an n-type semiconductor by doping InGaN, for example, with Si as an n-type dopant (e.g., at a doping concentration of $1\times10^{18}$ cm$^{-3}$), and the p-type InGaN guide layer 17 is formed of a p-type semiconductor by doping InGaN, for example, with Mg as a p-type dopant (e.g., at a doping concentration of $5\times10^{18}$ cm$^{-3}$).

The p-type AlGaN electron blocking layer 16 is formed of a p-type semiconductor by doping AlGaN, for example, with Mg as a p-type dopant (e.g., at a doping concentration of $5\times10^{18}$ cm$^{-3}$). The p-type AlGaN electron blocking layer 16 prevents electron leakage from the light emitting layer 10 to increase the efficiency of the recombination of the electrons and the positive holes. Where InGaN is thus used for the guide layers 15, 17, the Al content of the p-type AlGaN electron blocking layer 16 can be reduced (e.g., by 5% to 15%) as compared with a case in which the guide layers are GaN layers.

The light emitting layer 10 has an MQW (multiple-quantum well) structure, for example, containing InGaN, and serves to generate light through the recombination of the electrons and the positive holes and amplify the generated light. More specifically, the light emitting layer 10 includes a plurality of InGaN sublayers (each having a thickness not greater than 100 Å, e.g., a thickness of 3 nm) and a plurality of GaN sublayers (e.g., each having a thickness of 9 nm) alternately stacked repeatedly. In this case, the InGaN sublayers each have an In content of not less than 5% and hence a relatively small band gap, each serving as a quantum well layer. On the other hand, the GaN sublayers each have a relatively great band gap, each serving as a barrier layer. For example, the alternate stacking of the InGaN and GaN sublayers is repeated two to seven times to provide the light emitting layer 10 of the MQW structure. The light emission wavelength of the light emitting layer 10 is set, for example, at 450 nm to 550 nm by properly adjusting the In content of each of the quantum well layers (InGaN layers). In the MQW structure, the number of the In-containing quantum wells is preferably not greater than three.

More specifically, the In content of each of the quantum well layers is preferably 12% to 16% (e.g., 14%) for a light emission wavelength in a blue range around 460 nm. In this case, the In content of each of the InGaN guide layers 15, 17 is preferably 1% to 3% (e.g., 3%). For example, the guide layers 15, 17 are preferably each formed of $In_{0.03}GaN$.

Further, the In content of each of the quantum well layers is preferably 21% to 25% (e.g., 23%) for a light emission wavelength in a green range around 530 nm. In this case, the In content of each of the InGaN guide layers 15, 17 is preferably 3% to 5% (e.g., 5%). For example, the guide layers 15, 17 are preferably each formed of $In_{0.05}GaN$.

The p-type semiconductor layered portion 12 is formed in a ridge stripe 20 by partial removal thereof. More specifically, the p-type contact layer 19, the p-type GaN cladding layer 18 and the p-type InGaN guide layer 17 are partly etched away to be formed in the ridge stripe 20 having a generally trapezoidal shape (mesa shape) as seen in cross section. The ridge stripe 20 extends along a c-axis.

The Group III nitride semiconductor layered structure 2 has a pair of end faces 21, 22 (cleaved surfaces) formed at longitudinally opposite ends of the ridge stripe 20 by cleavage. The end faces 21, 22 extend parallel to each other perpendicularly to the c-axis. Thus, the n-type InGaN guide layer 15, the light emitting layer 10 and the p-type InGaN guide layer 17 constitute a Fabry-Perot resonator having resonator end faces respectively defined by the end faces 21, 22. That is, the light generated by the light emitting layer 10 reciprocates between the resonator end faces 21 and 22 to be amplified through induced emission. Then, a part of the amplified light is extracted as a laser beam from the device through the resonator end faces 21, 22.

The n-side electrode 3 is made of, for example, metal Al, and the p-side electrode 4 is made of, for example, a Pd/Au alloy. The n-side electrode 3 and the p-side electrode 4 have ohmic contact with the p-type contact layer 19 and the substrate 1, respectively. An insulating layer 6 covers exposed surfaces of the p-type InGaN guide layer 17 and the p-type GaN cladding layer 18 so that the p-side electrode 4 contacts only the p-type GaN contact layer 19 defining a top face (stripe contact region) of the ridge stripe 20. Thus, electric current is concentrated on the ridge stripe 20, thereby permitting efficient laser oscillation. Since a surface portion of the ridge stripe 20 except for the contact region in contact with the p-side electrode 4 is covered with the insulating layer 6 for protection, the light is moderately laterally confined. This permits easy control of the light confinement, and prevents current leakage from side faces. The insulating layer 6 is made of an insulative material, such as $SiO_2$ or $ZrO_2$, having a refractive index of greater than 1.

Further, the top face of the ridge stripe 20 is defined by the m-plane, and the p-side electrode 4 is provided on the m-plane. The rear surface of the substrate 1 provided with the n-side electrode 3 is also defined by the m-plane. Since the p-side electrode 4 and the n-side electrode 3 are each thus provided on the m-plane, the semiconductor laser diode 70 is highly reliable to sufficiently withstand a higher laser output and higher temperature operation.

The resonator end faces 21, 22 are respectively covered with insulating films 23, 24 (not shown in FIG. 1). The resonator end face 21 is a +c-side end face present on a plus side with respect to the c-axis, while the resonator end face 22 is a −c-side end face present on a minus side with respect to the c-axis. That is, the crystal plane of the resonator end face 21 is defined by a +c-plane, while the crystal plane of the resonator end face 22 is defined by a −c-plane. The insulating film 24 present on the −c-side serves as a protective film for protecting the −c-plane which is chemically vulnerable and liable to be dissolved in alkali, thereby improving the reliability of the semiconductor laser diode 70.

Figure 4:
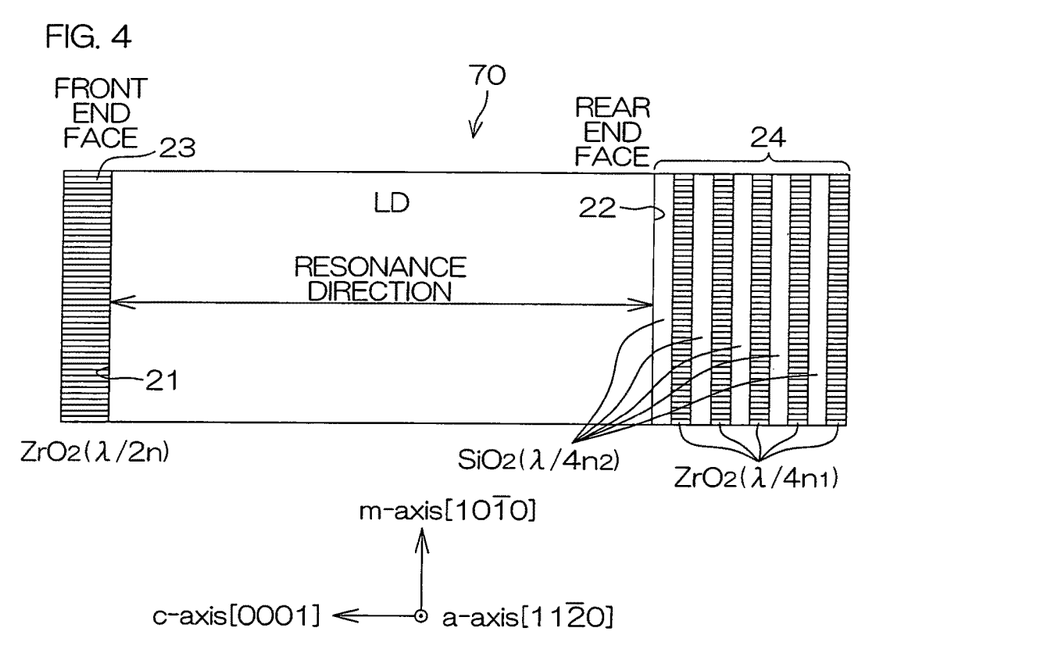
FIG. 4 is a schematic diagram for explaining the structures of insulating films (including a reflective film) respectively formed on resonator end faces.

As schematically shown in FIG. 4, the insulating film 23 covering the resonator end face 21 defined by the +c-plane is a single layer film such as of $ZrO_2$. On the other hand, the insulating film 24 provided on the resonator end face 22 defined by the −c-plane is a multi-layer reflective film which includes, for example, a plurality of $SiO_2$ films (five $SiO_2$ films in FIG. 4) and a plurality of $ZrO_2$ films (five $ZrO_2$ films in FIG. 4) alternately stacked repeatedly. The $ZrO_2$ single-layer film serving as the insulating film 23 has a thickness of $\lambda/2n_1$ (wherein $\lambda$ is the light emission wavelength of the light emitting layer 10 and $n_1$ is the refractive index of $ZrO_2$). On the other hand, the multi-layer reflective film serving as the insulating film 24 has a structure such that $SiO_2$ films each having a thickness of $\lambda/4n_2$ (wherein $n_2$ is the refractive index of $SiO_2$) and $ZrO_2$ films each having a thickness of $\lambda/4n_1$ are alternately stacked.

With this arrangement, the +c-side end face 21 has a lower reflectivity, and the −c-side end face 22 has a higher reflectivity. More specifically, the reflectivity of the +c-side end face 21 is, for example, about 20%, and the reflectivity of the −c-side end face 22 is, for example, about 99.5% (virtually 100%). Therefore, the laser beam is emitted at a higher laser output from the +c-side end face 21. That is, the +c-side end face 21 of the semiconductor laser diode 70 serves as a laser emitting end face.

With this arrangement, the n-side electrode 3 and the p-side electrode 4 are connected to a power supply, and electrons and positive holes are injected into the light emitting layer 10 from the n-type semiconductor layered portion 11 and the p-type semiconductor layered portion 12, respectively, whereby the electrons and the positive holes are recombined in the light emitting layer 10. Thus, light is generated, for example, at a wavelength of 450 nm to 550 nm. The light reciprocates between the resonator end faces 21 and 22 along the guide layers 15, 17 to be amplified through induced emission. Thus, a higher laser output is extracted from the resonator end face 21 serving as the laser emitting end face to the outside.

Figure 5:
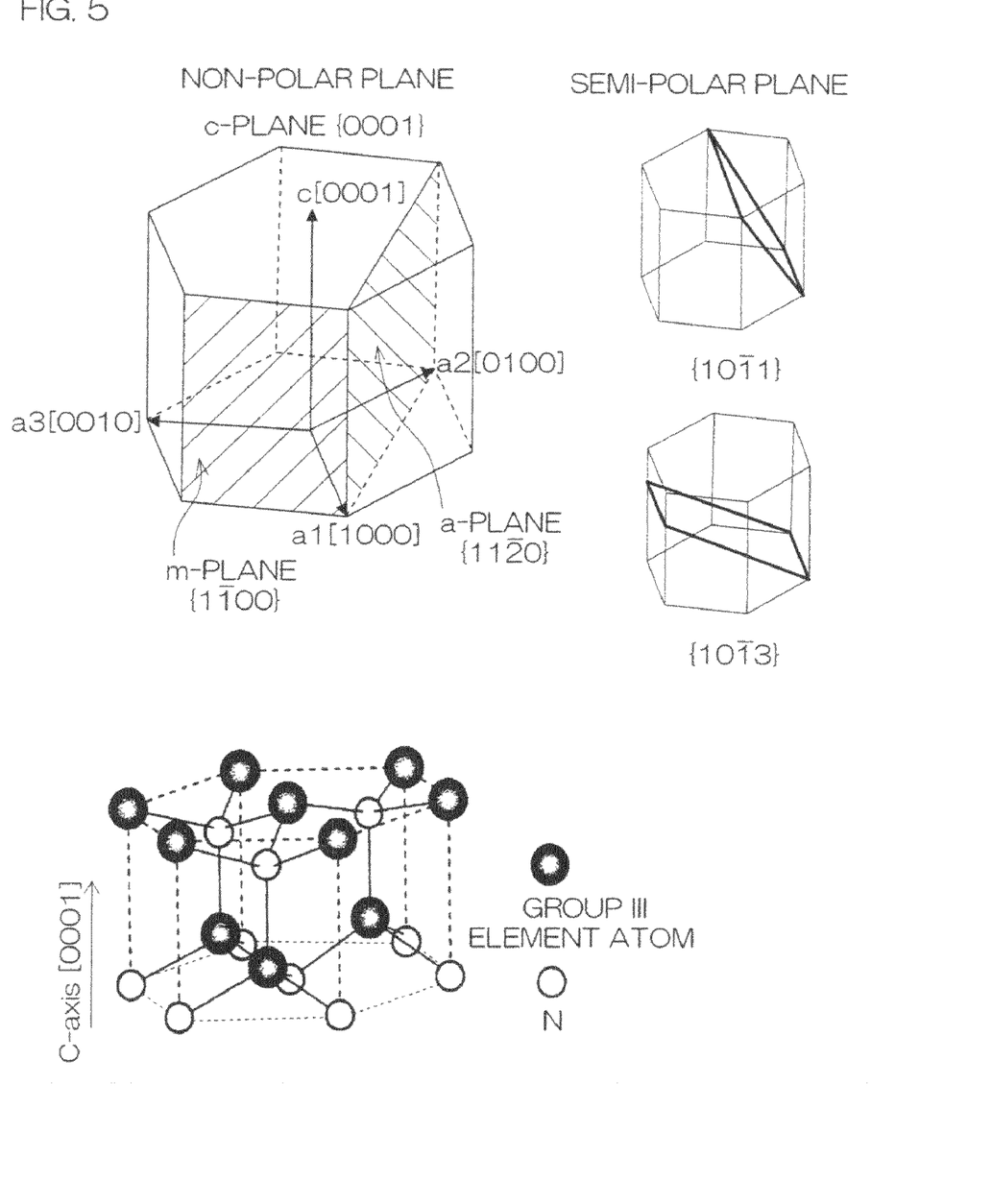
FIG. 5 is a schematic diagram illustrating a unit cell of a Group III nitride semiconductor crystal structure.

FIG. 5 is a schematic diagram illustrating a unit cell of the crystal structure of a Group III nitride semiconductor. The crystal structure of the Group III nitride semiconductor is approximately a hexagonal system, and four nitrogen atoms are bonded to each Group III element atom. The four nitrogen atoms are located at four vertexes of a tetrahedron with the Group III element atom located at the center of the tetrahedron. One of the four nitrogen atoms is located on a +c-side of the Group III element atom, and the other three nitrogen atoms are located on a −c-side of the Group III element atom. With this structure, the Group III nitride semiconductor is polarized in a polarization direction extending along a c-axis.

The c-axis extends axially of the hexagonal prism, and a plane (the top face of the hexagonal prism) normal to the c-axis is defined as a c-plane (0001). Where the crystal of the Group III nitride semiconductor is cleaved along two planes parallel to the c-plane, a +c-side plane (+c-plane) is defined as a crystal plane in which atoms of the Group III element are arranged, and a −c-side plane (−c-plane) is defined as a crystal plane in which nitrogen atoms are arranged. Since the +c-plane and the −c-plane are different in properties, the c-plane is referred to as polar plane.

The +c-plane and the −c-plane are different crystal planes and, therefore, exhibit different physical properties. More specifically, the +c-plane is invulnerable to alkali and highly durable with respect to chemical reactivity, while the −c-plane is chemically vulnerable and liable to be dissolved in alkali.

On the other hand, a side face of the hexagonal prism is defined as an m-plane (10-10), and a plane extending through a pair of nonadjacent ridges of the hexagonal prism is defined as an a-plane (11-20). Since the m-plane and the a-plane are crystal planes perpendicular to the c-plane and hence extend perpendicularly to the polarization direction, these planes are polarization-free planes, i.e., non-polar planes. Further, a crystal plane inclined with respect to the c-plane (neither parallel nor perpendicular to the c-plane) obliquely crosses the polarization direction and, therefore, is a slightly polarized plane, i.e., a semi-polar plane. Specific examples of the semi-polar plane include a (10-1-1) plane, a (10-1-3) plane and a (11-22) plane.

A relationship between the deviation angle of a crystal plane with respect to the c-plane and the polarization in a direction normal to the crystal plane is shown in T. Takeuchi et al., Jap. J. Appl. Phys. 39, 413-416, 2000. This literature states that the (11-24) plane and the (10-12) plane are also less polarized crystal planes which are expected to be used for extraction of highly polarized light.

For example, the GaN monocrystalline substrate with its major plane defined by the m-plane is prepared by cutting a GaN monocrystal having a major plane defined by the c-plane. The m-plane of the substrate thus cut out is polished, for example, by a chemical mechanical polishing method so as to have a deviation angle (off-angle) within ±1 degree (preferably within ±0.3 degree) with respect to a (0001) direction and a (11-20) direction. Thus, the GaN monocrystalline substrate is provided, which has a major plane defined by the m-plane and is free from crystal defects such as dislocation and layering defects. The GaN monocrystalline substrate merely has atomic-level steps on its surface.

The Group III nitride semiconductor layered structure 2 for the semiconductor laser diode structure is grown on the thus prepared GaN monocrystalline substrate through the metal-organic vapor phase epitaxy.

The Group III nitride semiconductor layered structure 2 was actually grown with its major growth plane defined by the m-plane on the GaN monocrystalline substrate 1 having the major plane defined by the m-plane, and an a-plane section of the Group III nitride semiconductor layered structure 2 was observed by means of an electron microscope (STEM: scanning transmission electron microscope). The observation shows that the Group III nitride semiconductor layered structure 2 was free from stria which is an indication of the presence of dislocation. Further, a surface of the Group III nitride semiconductor layered structure 2 was observed by means of an optical microscope. The observation shows that the surface of the Group III nitride semiconductor layered structure 2 has a flatness of not greater than 10 Å as measured with respect to the c-axis (as measured as a height difference between the highest portion and the lowest portion). This means that the flatness of the light emitting layer 10, particularly the flatness of each of the quantum well layers, with respect to the c-axis is not greater than 10 Å. Therefore, the half bandwidth of the light emission spectrum is reduced.

Thus, the m-plane Group III nitride semiconductors can be grown as having flat layer interfaces free from dislocation. However, the major surface of the GaN monocrystalline substrate 1 preferably has an off-angle within ±1 degree (preferably ±0.3 degree). If the m-plane GaN monocrystalline substrate on which the GaN semiconductor layers are grown has an off-angle of 2 degrees, for example, the GaN crystal will be grown in a terrace form, failing to have a flat surface unlike in the case in which the off-angle is within ±1 degree.

The Group III nitride semiconductor crystal grown on the GaN monocrystalline substrate having a major surface defined by the m-plane has a major growth plane defined by the m-plane. Where the major crystal growth plane is defined by the c-plane, the light emission efficiency of the light emitting layer 10 is liable to be reduced due to the polarization along the c-axis. Where the major crystal growth plane is defined by the m-plane, on the contrary, the polarization in the quantum well layers is suppressed, thereby increasing the light emission efficiency. This reduces the threshold, and increases the slope efficiency. With reduced polarization, the light emission wavelength is less dependent upon the current, thereby stabilizing the oscillation.

With the major crystal growth plane being defined by the m-plane, the Group III nitride semiconductor crystal can be stably grown. As compared with a case in which the major crystal growth plane is defined by the c-plane or the a-plane, the crystal quality is improved. Thus, the laser diode can be produced as having higher performance.

The light emitting layer 10 is composed of the Group III nitride semiconductors grown with the major crystal growth plane defined by the m-plane, so that the light generated by the light emitting layer 10 is optically polarized along the a-axis, i.e., in a direction parallel to the m-plane. In the case of a TE mode, the light travels along the c-axis. In other words, the proportion of photons polarized along the a-axis and emitted along the a-plane is increased, so that the proportion of the light transmitted along the c-axis is increased even without lateral light confinement. In the semiconductor laser diode 70, therefore, the major crystal growth plane is parallel to the optical polarization direction, and the stripe extending direction or an optical waveguide extending direction is parallel to the light traveling direction. Thus, oscillation is easily caused in the TE mode, so that a threshold current for causing the laser oscillation can be reduced.

In other words, with the major crystal growth plane being defined by the m-plane, physical anisotropy is observed with respect to the c-axis and the a-axis. Further, the In-containing light emitting layer 10 is allowed to have a quantum well band structure different from that of a semiconductor laser diode having a major crystal growth plane defined by the c-plane due to a biaxial stress attributable to lattice strain. As a result, a gain different from that provided by the Group III nitride semiconductor having the major crystal growth plane defined by the c-plane is provided, thereby improving laser characteristics.

In this embodiment, the GaN monocrystalline substrate is used as the substrate 1, so that the Group III nitride semiconductor layered structure 2 has a higher crystal quality with little defects. As a result, the laser diode can be provided as having higher performance.

Further, the Group III nitride semiconductor layered structure 2 is grown on the GaN monocrystalline substrate substantially free from dislocation, whereby the Group III nitride semiconductor layered structure 2 is composed of excellent crystal free from layering defects and threading dislocation attributable to the growth plane (m-plane) of the substrate 1. This minimizes characteristic degradation such as reduction in light emission efficiency attributable to the defects.

Figure 6A:
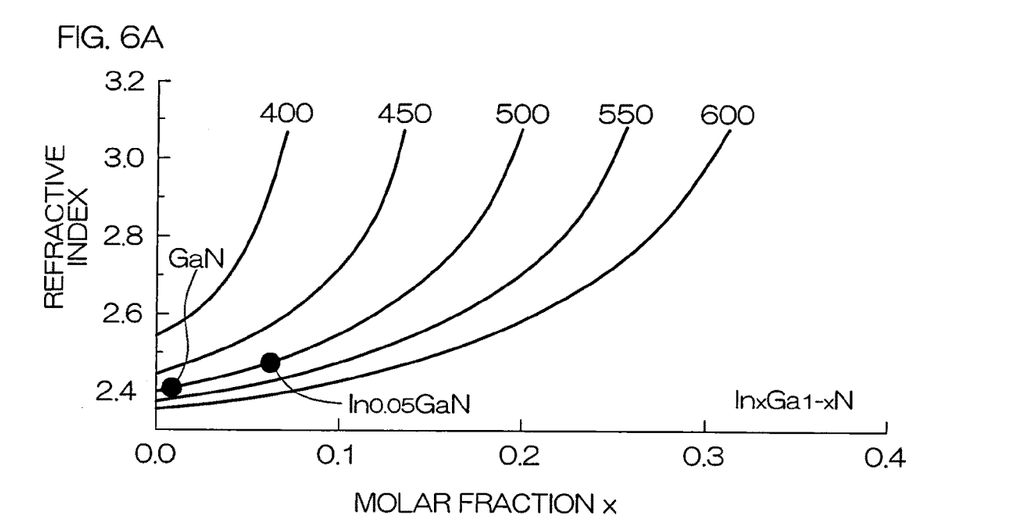
FIG. 6A is a diagram showing changes in refractive index with respect to the In content x of $In_xGa_{1-x}N$.
Figure 6B:
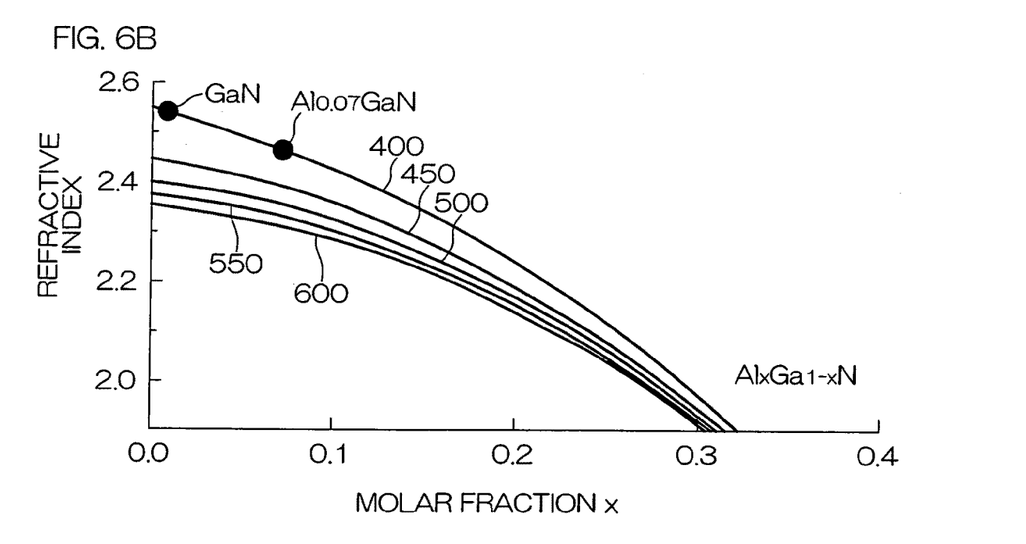
FIG. 6B is a diagram showing changes in refractive index with respect to the Al content x of $Al_xGa_{1-x}N$.

FIG. 6A is a diagram showing changes in refractive index with respect to the In content x of $In_xGa_{1-x}N$, and FIG. 6B is a diagram showing changes in refractive index with respect to the Al content x of $Al_xGa_{1-x}N$. In FIGS. 6A and 6B, curves respectively show changes in refractive index at different wavelengths, i.e., at wavelengths of 400 nm, 450 nm, 500 nm, 550 nm and 600 nm. A curve showing a change in the refractive index of InGaN at a wavelength of 500 nm indicates that GaN having an In content of zero has a refractive index of 2.4, and $In_{0.05}GaN$ having an In content of 0.05 has a refractive index of 2.45. Therefore, where the cladding layers 14, 18 are each composed of GaN and the guide layers 15, 17 are each composed of $In_{0.05}GaN$, a difference Δn in refractive index between the cladding layers 14, 18 and the guide layers 15, 17 is 0.05, thereby permitting proper light confinement. In addition, the Al content is zero, so that the cracking is suppressed to improve the yield.

More specifically, where the cladding layers 14, 18 are each composed of GaN and the guide layers 15, 17 are each composed of $In_xGa_{1-x}N$ having an In content x of 0.04, the refractive index difference Δn is 0.045 at a wavelength of 460 nm. Therefore, for a light emitting layer 10 having a light emission wavelength in a blue range around 460 nm, for example, the cladding layers 14, 18 are preferably each composed of GaN and the In content x of $In_xGa_{1-x}N$ for the guide layers 15, 17 is preferably set in the range of 0.04 to 0.06. Where the cladding layers 14, 18 are each composed of GaN and the guide layers 15, 17 are each composed of $In_xGa_{1-x}N$ having an In content x of 0.05, for example, the refractive index difference Δn is 0.045 at a wavelength of 530 nm. Therefore, for a light emitting layer 10 having a light emission wavelength in a green range around 530 nm, for example, the cladding layers 14, 18 are preferably each composed of GaN and the In content x of $In_xGa_{1-x}N$ for the guide layers 15, 17 is preferably set in the range of 0.05 to 0.06.

Where InGaN layers (including the GaN layers) having different In contents are used in combination for the cladding layers 14, 18 and the guide layers 15, 17, a problem associated with increased lattice mismatch is less liable to occur even with an increased In content unlike in the case which employs AlGaN layers. Accordingly, the cracking is less liable to occur. Therefore, the In contents are properly selected for the cladding layers 14, 18 and the guide layers 15, 17 so as to provide a necessary refractive index difference Δn. As can be understood from FIG. 6A, a combination of the cladding layers 14, 18 and the guide layers 15, 17 which provides a refractive index difference Δn of not less than 0.04 (preferably not less than 0.05) can be easily designed for any wavelength range.

Even with the use of AlGaN, on the other hand, an average Al content of less than 7% (preferably less than 5%) suppresses the cracking attributable to the lattice mismatch. Therefore, AlGaN having an Al content in the aforementioned range may be used for the cladding layers 14, 18. More specifically, where the cladding layers 14, 18 are each composed of $Al_yGa_{1-y}N$ having an Al content y of 0.03 and the guide layers 15, 17 are each composed of $In_xGa_{1-x}N$ having an In content x of 0.02, for example, the refractive index difference Δn is 0.045. Therefore, for a light emitting layer 10 having a light emission wavelength in the blue range around 460 nm, for example, the Al content y of $Al_yGa_{1-y}N$ for the cladding layers 14, 18 is preferably set in the range of 0.03 to 0.07 (preferably 0.03 to 0.05), and the In content x of $In_xGa_{1-x}N$ for the guide layers 15, 17 is preferably set in the range of 0.02 to 0.06 (preferably 0.02 to 0.04). Further, where the cladding layers 14, 18 are each composed of $Al_yGa_{1-y}N$ having an Al content y of 0.03 and the guide layers 15, 17 are each composed of $In_xGa_{1-x}N$ having an In content x of 0.04, for example, the refractive index difference Δn is 0.045 at a wavelength of 530 nm. Therefore, for a light emitting layer 10 having a light emission wavelength in the green range around 530 nm, for example, the Al content y of $Al_yGa_{1-y}N$ for the cladding layers 14, 18 is preferably set in the range of 0.03 to 0.07 (preferably 0.03 to 0.05), and the In content x of $In_xGa_{1-x}N$ for the guide layers 15, 17 is preferably set in the range of 0.04 to 0.06 (preferably about 0.04).

Figure 7:
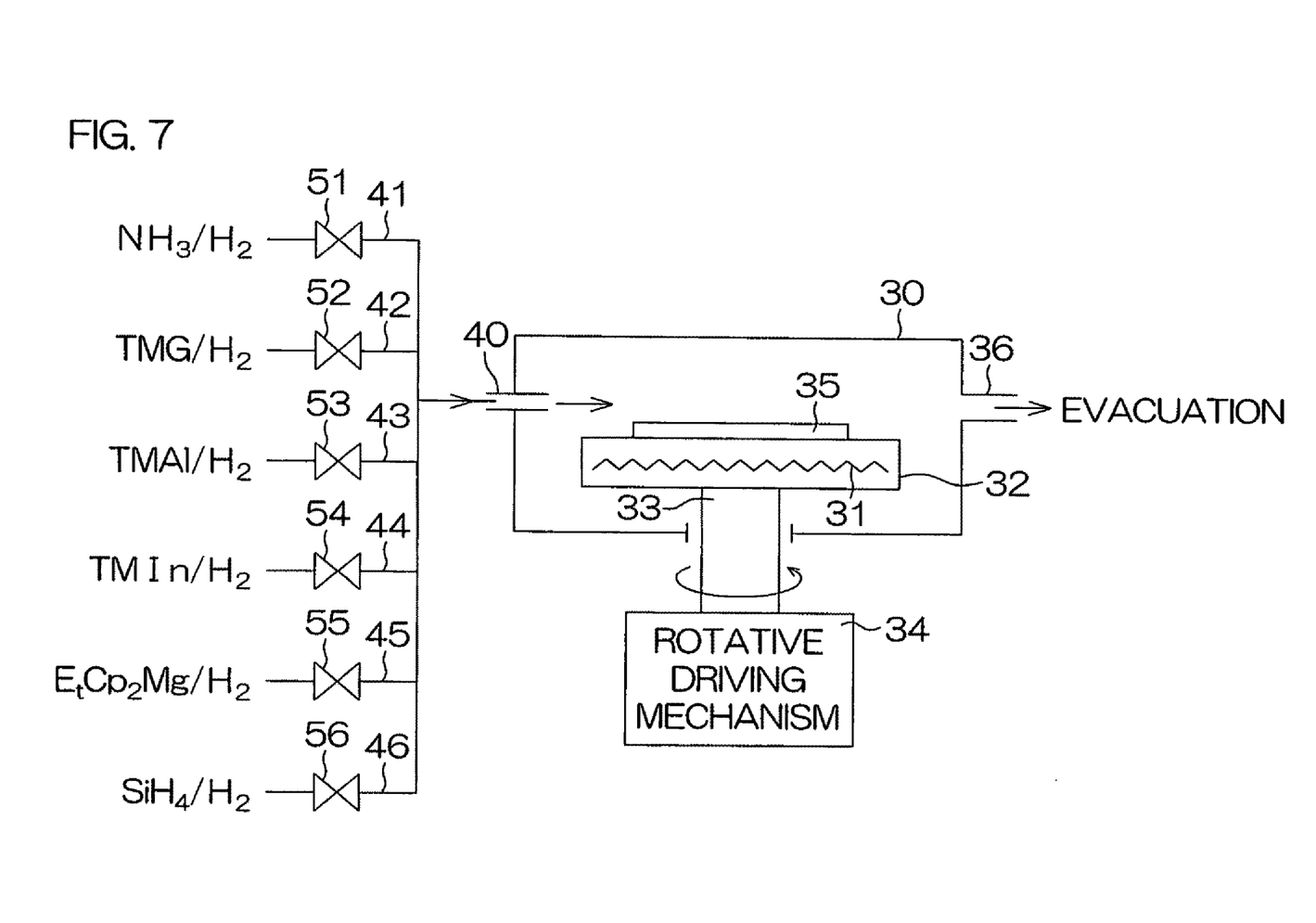
FIG. 7 is a schematic diagram for explaining the construction of a processing apparatus for growing respective layers of the Group III nitride semiconductor layered structure.

FIG. 7 is a schematic diagram for explaining the construction of a processing apparatus for growing the respective layers of the Group III nitride semiconductor layered structure 2. A susceptor 32 including a built-in heater 31 is provided in a processing chamber 30. The susceptor 32 is connected to a rotation shaft 33, which is rotated by a rotative driving mechanism 34 disposed outside the processing chamber 30. With this arrangement, a wafer 35 to be processed is held on the susceptor 32. Thus, the wafer 35 can be heated up to a predetermined temperature, and rotated. The wafer 35 is a GaN monocrystalline wafer to be used as the aforementioned GaN monocrystalline substrate 1.

An exhaust pipe 36 is connected to the processing chamber 30. The exhaust pipe 36 is further connected to an evacuation facility such as a rotary pump. Thus, the internal pressure of the processing chamber 30 is kept at ⅒ atm to an atmospheric pressure, while the processing chamber 30 is constantly evacuated.

A material gas supply path 40 for supplying material gases toward a surface of the wafer 35 held by the susceptor 32 is introduced into the processing chamber 30. The material gas supply path 40 is connected to a nitrogen material supply pipe 41 for supplying ammonia as a nitrogen material gas, a gallium material supply pipe 42 for supplying trimethylgallium (TMG) as a gallium material gas, an aluminum material supply pipe 43 for supplying trimethylaluminum (TMAl) as an aluminum material gas, an indium material supply pipe 44 for supplying trimethylindium (TMIn) as an indium material gas, a magnesium material supply pipe 45 for supplying ethylcyclopentadienylmagnesium (EtCp$_2$Mg) as a magnesium material gas, and a silicon material supply pipe 46 for supplying silane (SiH$_4$) as a silicon material gas. Valves 51 to 56 are respectively provided in these material supply pipes 41 to 46. The material gases are each supplied together with a carrier gas such as hydrogen gas and/or nitrogen gas (not shown)

For example, a GaN monocrystalline wafer having a major plane defined by the m-plane is held as the wafer 35 on the susceptor 32. In this state, the carrier gas and the ammonia gas (nitrogen material gas) are supplied into the processing chamber 30 with the valves 52 to 56 being closed and with the nitrogen material valve 51 being open. Further, the heater 31 is energized to heat the wafer up to a wafer temperature of 1000° C. to 1100° C. (e.g., up to 1050° C.). Thus, Group III nitride semiconductors can be grown without surface roughening.

After the wafer temperature reaches 1000° C. to 1100° C., the nitrogen material valve 51, the gallium material valve 52 and the silicon material valve 56 are opened. Thus, ammonia, trimethylgallium and silane are supplied together with the carrier gas from the material gas supply path 40. As a result, a GaN layer is grown on the surface of the wafer 35 while being doped with silicon. Thus, an n-type GaN contact layer 13 is formed.

Subsequently, ammonia, trimethylgallium and silane are supplied together with the carrier gas from the material gas supply path 40 with the nitrogen material valve 51, the gallium material valve 52 and the silicon material valve 56 kept open. As a result, an n-type GaN cladding layer 14 is formed on the n-type GaN contact layer 13 through epitaxial growth.

As described above, the n-type cladding layer 14 may be composed of AlGaN having an average Al content of less than 7%. In this case, trimethylaluminum is supplied in addition to ammonia, trimethylgallium and silane together with the carrier gas from the material gas supply path 40 with the aluminum material valve 53 as well as the nitrogen material valve 51, the gallium material valve 52 and the silicon material valve 56 being open. As a result, an n-type AlGaN cladding layer 14 is formed on the n-type GaN contact layer 13 through epitaxial growth.

In turn, the indium material valve 54 is opened in addition to the nitrogen material valve 51, the gallium material valve 52 and the silicon material valve 56. Thus, ammonia, trimethylgallium, silane and trimethylindium are supplied together with the carrier gas from the material gas supply path 40. As a result, an n-type InGaN guide layer 15 is formed on the n-type GaN cladding layer 14 through epitaxial growth. During the formation of the n-type InGaN guide layer 15, the wafer 35 is preferably kept at a temperature of 800° C. to 900° C. (e.g., 850° C.). The In content of the n-type InGaN guide layer 15 is, for example, 5% (for a light emission wavelength in the green range around 530 nm).

Then, the silicon material valve 56 is closed, and a light emitting layer (active layer) 10 of a multiple-quantum well structure is formed. For the formation of the light emitting layer 10, the step of supplying ammonia, trimethylgallium and trimethylindium to the wafer 35 with the nitrogen material valve 51, the gallium material valve 52 and the indium material valve 54 being open for growing an InGaN layer (quantum well layer) and the step of supplying ammonia and trimethylgallium to the wafer 35 with the indium material valve 54 being closed and with the nitrogen material valve 51 and the gallium material valve 52 kept open for growing an indium-free GaN layer (barrier layer) are alternately performed. For example, a GaN layer is first formed, and then an InGaN layer is formed on the GaN layer. The formation of the GaN layer and the formation of the InGaN layer are repeated, for example, five times. During the formation of the light emitting layer 10, the wafer 35 is preferably kept, for example, at a temperature of 700° C. to 800° C. (e.g., 730° C.). At this time, a pressure for the growth is preferably not less than 700 torr. Thus, the heat resistance is improved. As described above, the In content of the InGaN layer (quantum well layer) is properly adjusted depending on the light emission wavelength.

In turn, a p-type electron blocking layer 16 is formed. More specifically, the nitrogen material valve 51, the gallium material valve 52, the aluminum material valve 53 and the magnesium material valve 55 are opened, and the other valves 54, 56 are closed. Thus, ammonia, trimethylgallium, trimethylaluminum and ethylcyclopentadienylmagnesium are supplied toward the wafer 35, whereby the p-type electron blocking layer 16 is formed of magnesium-doped AlGaN layer. During the formation of the p-type electron blocking layer 16, the wafer 35 is preferably kept at a temperature of 1000° C. to 1100° C. (e.g., 1000° C.).

Then, the aluminum material valve 53 is closed, and the nitrogen material valve 51, the gallium material valve 52, the indium material valve 54 and the magnesium material valve 55 are opened. Thus, ammonia, trimethylgallium, trimethylindium and ethylcyclopentadienylmagnesium are supplied toward the wafer 35, whereby a guide layer 17 is formed of magnesium-doped p-type InGaN layer. During the formation of the p-type InGaN guide layer 17, the wafer 35 is preferably kept at a temperature of 800° C. to 900° C. (e.g., 850° C.). The In content of the p-type InGaN guide layer 17 is, for example, 5% (for a light emission wavelength in the green range around 530 nm).

In turn, the indium material valve 54 is closed. That is, the nitrogen material valve 51, the gallium material valve 52 and the magnesium material valve 55 are kept open with the other valves 53, 54, 56 being closed. Thus, ammonia, trimethylgallium and ethylcyclopentadienylmagnesium are supplied toward the wafer 35, whereby a cladding layer 18 is formed of magnesium-doped p-type GaN layer. During the formation of the p-type GaN cladding layer 18, the wafer 35 is preferably kept at a temperature of 900° C. to 1100° C. (e.g., 1000° C.).

As described above, the p-type cladding layer 18 may be composed of AlGaN having an average Al content of less than 7%. In this case, trimethylaluminum is supplied in addition to ammonia, trimethylgallium and ethylcyclopentadienylmagnesium together with the carrier gas from the material gas supply path 40 with the aluminum material valve 53 as well as the nitrogen material valve 51, the gallium material valve 52 and the magnesium material valve 55 being open. As a result, a p-type AlGaN cladding layer 18 is formed on the p-type guide layer 17 through epitaxial growth.

Then, a p-type contact layer 19 is formed. More specifically, the nitrogen material valve 51, the gallium material valve 52 and the magnesium material valve 55 are kept open with the other valves 53, 54, 56 being closed. Thus, ammonia, trimethylgallium and ethylcyclopentadienylmagnesium are supplied toward the wafer 35, whereby a p-type GaN contact layer 19 is formed of magnesium-doped GaN layer. During the formation of the p-type GaN contact layer 19, the wafer 35 is preferably kept at a temperature of 900° C. to 1100° C. (e.g. 1000° C.).

The crystals of the respective layers of the p-type semiconductor layered portion 12 are preferably grown at an average crystal growth temperature not higher than 1000° C. This reduces thermal damages to the light emitting layer 10.

When the layers 10 and 13 to 19 of the Group III nitride semiconductor layered structure 2 are grown on the wafer 35 (GaN monocrystalline substrate 1), a V/III ratio indicating the molar fraction ratio of the nitrogen material (ammonia) to the gallium material (trimethylgallium) supplied to the wafer 35 in the processing chamber 30 is kept at a higher level, i.e., at a level not less than 1000 (preferably, not less than 3000), for the growth of each of the layers. More specifically, the average of the V/III ratios for the layers ranging from the n-type cladding layer 14 to the uppermost p-type contact layer 19 is preferably not less than 1000. Thus, the n-type cladding layer 14, the light emitting layer 10 and the p-type cladding layer 18 can be each formed of excellent crystal with little point defects.

The internal pressure of the processing chamber 30 for the formation of the respective layers of the Group III nitride semiconductor layered structure 2 is about 20 kPa for the AlGaN layer, and about 40 kPa to about 100 kPa for the other layers (the GaN layers and the InGaN layers). Since the p-type AlGaN electron blocking layer 16 has a reduced Al content as described above, the internal pressure of the processing chamber 30 need not be reduced, but may be kept at a level higher than 20 kPa. Thus, the Group III nitride semiconductor layered structure 2 does not include a higher Al-content layer, thereby suppressing the cracking and obviating the need for significantly changing the internal pressure during the crystal growth. This facilitates the designing of the processing apparatus for the crystal growth of the Group III nitride semiconductor layered structure 2. Where the p-type electron blocking layer 16 is composed of GaN and the cladding layers 14, 18 are each composed of GaN layer, the Group III nitride semiconductor layered structure 2 is formed of Al-free Group III nitride semiconductors. This reliably suppresses the cracking, and minimizes a pressure change during the crystal growth.

In this embodiment, the Group III nitride semiconductor layered structure 2 with its major plane defined by the m-plane or the like is flatly grown without dislocation by setting the V/III ratio at a higher level as described above without provision of a buffer layer between the GaN monocrystalline substrate 1 and the Group III nitride semiconductor layered structure 2. The Group III nitride semiconductor layered structure 2 is free from layering defects and threading dislocation attributable to the major surface of the GaN monocrystalline substrate 1.

After the Group III nitride semiconductor layered structure 2 is thus grown on the wafer 35, the wafer 35 is transferred into an etching apparatus, in which ridge stripes 20 are formed by partly removing the p-type semiconductor layered portion 12 by dry etching such as plasma etching. The ridge stripes 20 extend parallel to the c-axis.

After the formation of the ridge stripes 20, an insulating layer 6 is formed. The formation of the insulating layer 6 is achieved, for example, through a lift-off process. More specifically, a stripe-shaped mask is formed, and then a thin insulator film is formed as entirely covering the p-type GaN cladding layer 18 and the p-type GaN contact layer 19. Thereafter, the thin insulator film is partly lifted off to expose the p-type GaN contact layer 19, whereby the insulating layer 6 is formed.

In turn, a p-side electrode 4 is formed in ohmic contact with the p-type GaN contact layer 19, and an n-side electrode 3 is formed in ohmic contact with the n-type GaN contact layer 13. The formation of these electrodes 3, 4 is achieved with the use of a metal vapor deposition apparatus utilizing resistive heating or an electron beam.

In the next step, the resulting wafer 35 is divided into individual elements. More specifically, the wafer 35 is cleaved parallel and perpendicularly to the ridge stripes 20, whereby elements of semiconductor laser diodes are separated from each other. The cleavage parallel to the ridge stripes occurs along the a-plane. Further, the cleavage perpendicular to the ridge stripes 20 occurs along the c-plane. Thus, resonator end faces 21, 22 of each of the elements are formed as being respectively defined by the +c-plane and the −c-plane.

Then, insulating films 23, 24 are respectively formed on the resonator end faces 21, 22. The formation of the insulating films 23, 24 is achieved, for example, by an electron cyclotron resonance (ECR) film forming method.

Figure 8:
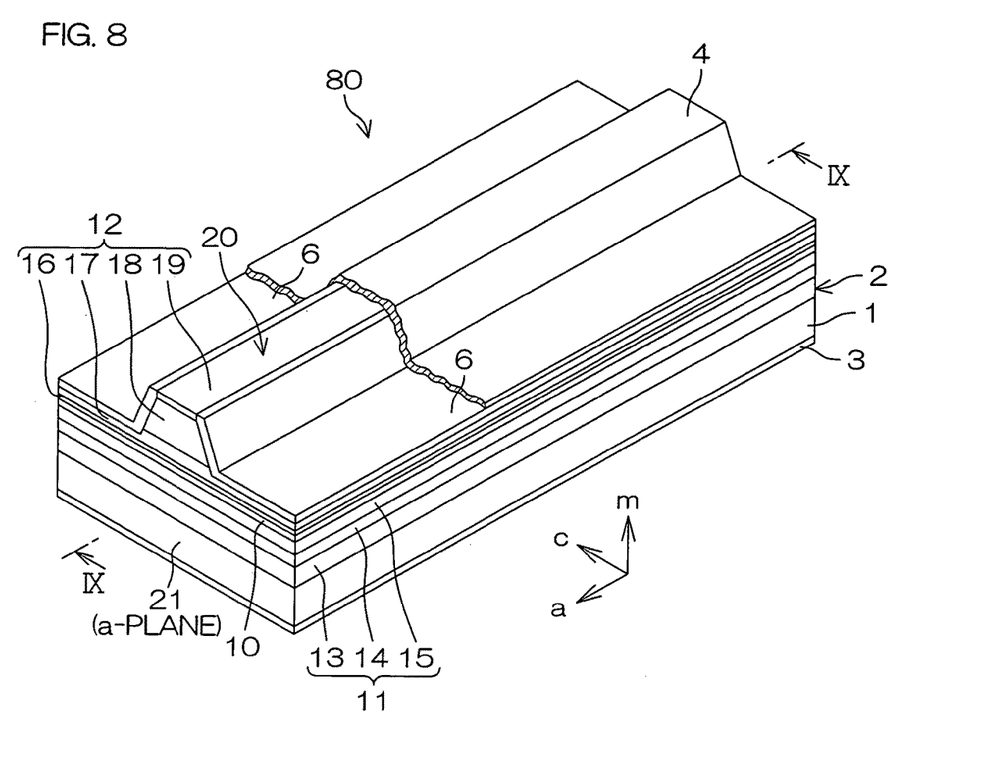
FIG. 8 is a perspective view showing the construction of a semiconductor laser diode according to a second embodiment of the present invention.
Figure 9:
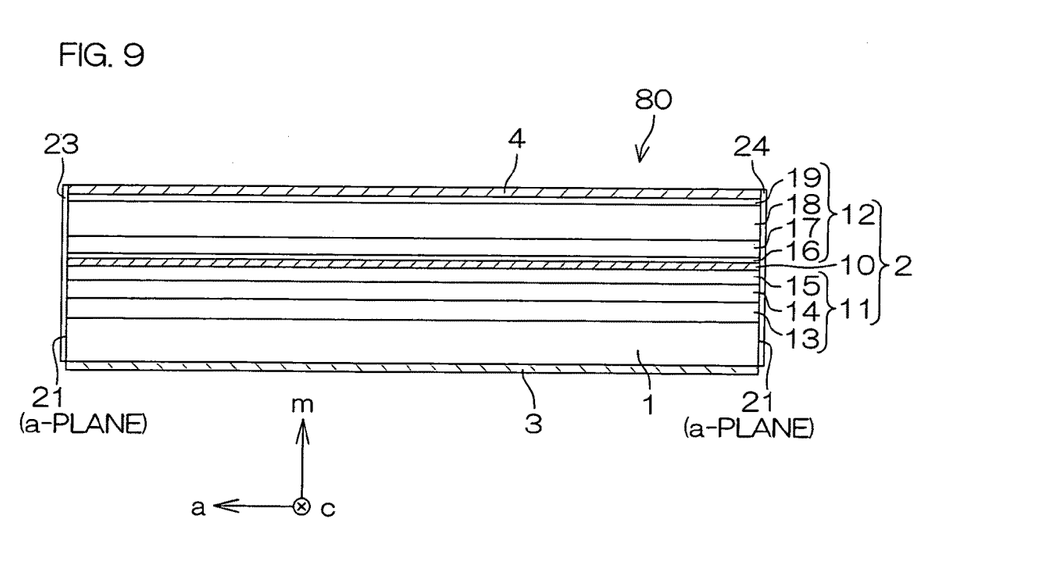
FIG. 9 is a longitudinal sectional view taken along a sectional line IX-IX in FIG. 8.

FIG. 8 is a perspective view showing the construction of a semiconductor laser diode according to a second embodiment of the present invention, and FIG. 9 is a longitudinal sectional view taken along a sectional line IX-IX in FIG. 8. In FIGS. 8 and 9, portions corresponding to those shown in FIGS. 1 to 3 will be denoted by the same reference characters as in FIGS. 1 to 3.

In the semiconductor laser diode 80 according to this embodiment, the ridge stripe 20 extends parallel to the a-axis, so that the resonator end faces 21, 22 are each defined by the a-plane. These resonator end faces 21, 22 are each a cleaved surface formed by cleavage.

Layering defects are liable to occur parallel to the c-plane when the Group III nitride semiconductor layered structure 2 is epitaxially grown. In the arrangement according to the first embodiment, therefore, the layering defects are liable to cross the optical waveguide. In this embodiment, on the contrary, the stripe extending direction is parallel to the a-axis, so that the optical waveguide extends parallel to the a-axis. Since the a-axis is parallel to the c-plane, the layering defects occurring parallel to the c-plane do not cross the optical waveguide. This prevents the layering defects from interfering with the optical waveguide and from increasing the leak current.

Figure 10:
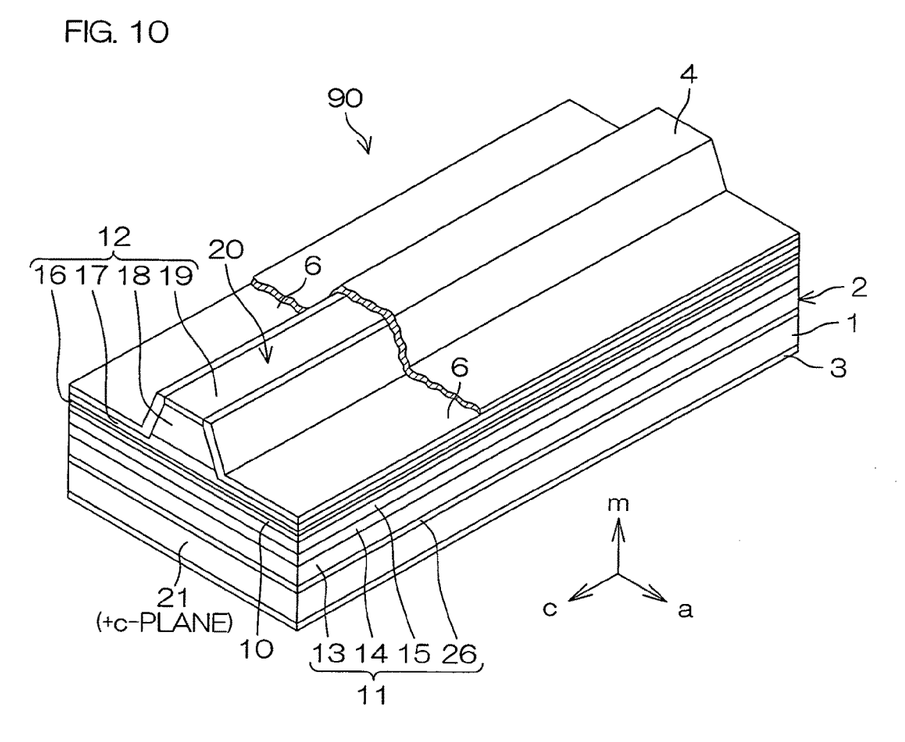
FIG. 10 is a perspective view for explaining the construction of a semiconductor laser diode according to a third embodiment of the present invention.

FIG. 10 is a perspective view for explaining the construction of a semiconductor laser diode according to a third embodiment of the present invention. In FIG. 10, portions corresponding to those shown in FIG. 1 will be denoted by the same reference characters as in FIG. 1.

In the semiconductor laser diode 90 according to this embodiment, the Group III nitride semiconductor layered structure 2 includes an In-containing layer having a biaxial stress, i.e., an n-type InGaN layer 26 (for example, having a thickness of 0.1 μm and an n-type impurity concentration of $1 \times 10^{18}$ cm$^{-3}$), provided between the substrate 1 and the n-type GaN contact layer 13. The provision of the n-type InGaN layer 26 suppresses cracking occurring parallel to the c-plane in the Group III nitride semiconductor layered structure 2 due to reduction in the biaxial stress and the lattice constant.

Where a GaN monocrystalline substrate 1 having a major plane defined by the m-plane is used as the substrate 1 and the Group III nitride semiconductor layered structure 2 is grown on the substrate 1, the major growth plane of the Group III nitride semiconductor layered structure 2 is defined by the m-plane. Of course, the n-type InGaN layer 26 is also grown with its major growth plane defined by the m-plane. Thus, the n-type InGaN layer 26 has a biaxial stress.

While the three embodiments of the present invention have thus been described, the invention may be embodies in other ways. The thicknesses and the impurity concentrations of the respective layers of the Group III nitride semiconductor layered structure 2 are shown by way of example, and may be arbitrarily determined as appropriate. The cladding layers 14, 18 are not necessarily required to be a single layer of GaN or AlGaN, but may be each formed of a superlattice multilayer of AlGaN layer and GaN layer.

Further, the substrate 1 may be removed, for example, by laser lift-off, after the formation of the Group III nitride semiconductor layered structure 2. In this case, a substrate-free semiconductor laser diode is provided.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-130753 filed in the Japanese Patent Office on May 16, 2007, the disclosure of which is incorporated herein by reference in its entirety.

What is claimed is:

1. A semiconductor laser diode comprising:
   a GaN monocrystalline substrate; and
   a Group III nitride semiconductor layered structure having a major crystal growth plane defined by a non-polar or semi-polar plane, the Group III nitride semiconductor layered structure being formed on the substrate,
   wherein the Group III nitride semiconductor layered structure comprises:
      a p-type cladding layer and an n-type cladding layer;
      an In-containing p-type guide layer and an In-containing n-type guide layer disposed between the p-type cladding layer and the n-type cladding layer; and
      an In-containing light emitting layer disposed between the p-type guide layer and the n-type guide layer,
   wherein the cladding layers are each composed of a Group III nitride semiconductor having an average Al content of less than 7%,
   wherein a refractive index difference between the guide layers and the cladding layers is not less than 0.04, and
   wherein the Group III nitride semiconductor layered structure has a major crystal growth plane defined by an m-plane.

2. A semiconductor laser diode as set forth in claim 1, wherein the cladding layers are each composed of a Group III nitride semiconductor free from Al.

3. A semiconductor laser diode as set forth in claim 1, wherein the light emitting layer has a multiple-quantum well structure including a plurality of In-containing well layers each having a thickness not greater than 100 Å.

4. A semiconductor laser diode as set forth in claim 1, wherein the Group III nitride semiconductor layered structure is formed through crystal growth on the substrate.

5. A semiconductor laser as set forth in claim 1, wherein the light emitting layer emits light has a wavelength of not less than about 450 nm.

6. A semiconductor laser as set forth in claim 5, wherein the wavelength is approximately 460 nm.

7. A semiconductor layer as set forth in claim 5, wherein the wavelength is approximately 530 nm.

8. A semiconductor laser diode comprising:
   a GaN monocrystalline substrate; and
   a Group III nitride semiconductor layered structure having a major crystal growth plane defined by a non-polar or semi-polar plane, the Group III nitride semiconductor layered structure being formed on the substrate,
   wherein the Group III nitride semiconductor layered structure comprises:
      a p-type cladding layer and an n-type cladding layer;
      an In-containing p-type guide layer and an In-containing n-type guide layer disposed between the p-type cladding layer and the n-type cladding layer; and
      an In-containing light emitting layer disposed between the p-type guide layer and the n-type guide layer,
   wherein the cladding layers are each composed of a Group III nitride semiconductor having an average Al content of less than 7%,
   wherein the light emitting layer has a multiple-quantum well structure including a plurality of In-containing well layers each having a thickness not greater than 100 Å, and
   wherein the Group III nitride semiconductor layered structure has a major crystal growth plane defined by an m-plane.

9. A semiconductor laser diode as set forth in claim 5, wherein the cladding layers are each composed of a Group III nitride semiconductor free from Al.

10. A semiconductor laser diode as set forth in claim 5, wherein the Group III nitride semiconductor layered structure is formed through crystal growth on the substrate.

* * * * *